United States Patent
Inoue et al.

(12) 
(10) Patent No.: US 6,251,544 B1
(45) Date of Patent: *Jun. 26, 2001

(54) EXPOSURE DOSE MEASURING METHOD AND EXPOSURE DOSE MEASURING MASK

(75) Inventors: Soichi Inoue; Shinichi Ito; Kei Hayasaki, all of Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/334,941

(22) Filed: Jun. 17, 1999

(30) Foreign Application Priority Data

Jun. 18, 1998 (JP) .................................... 10-171345

(51) Int. Cl.$^7$ ......................................... G03F 9/00
(52) U.S. Cl. ................ 430/5; 430/30; 382/145
(58) Field of Search .......................... 430/5, 30; 382/145

(56) References Cited

U.S. PATENT DOCUMENTS 5,976,741 * 11/1999 Ziger et al. ............................. 430/30

FOREIGN PATENT DOCUMENTS 2-74023   2/1990 (JP) .
7-332936  12/1995 (JP) .

OTHER PUBLICATIONS

Alexander Starikov, "Exposure Monitor Structure", *SPIE*, vol. 1261 Integrated Circuit Metrology, Inspection, and Process Control IV, (1990).

* cited by examiner

Primary Examiner—Christopher G. Young
(74) Attorney, Agent, or Firm—Finnegan, Henderson, Farabow, Garrett, & Dunner, L.L.P.

(57) ABSTRACT

In an exposure dose measuring method for measuring an effective exposure dose on a wafer by printing mask patterns formed on a mask onto a resist coated on the wafer by exposure, each of the mask patterns has light transmitting sections and light shielding sections repeated in a period p, a ratio of areas of the light transmitting sections to areas of the light shielding sections of each of the mask patterns differs from ratios of those of the others of the mask patterns, and the period p is set so as to satisfy a relationship of $$p/M \leq \lambda/(1+\sigma)NA,$$

where an exposure light wavelength at the time of exposing the mask patterns is $\lambda$, a numerical aperture at a wafer side is NA, an illumination coherence factor is $\sigma$, and a mask pattern magnification for patterns to be formed on the wafer is M.

17 Claims, 12 Drawing Sheets

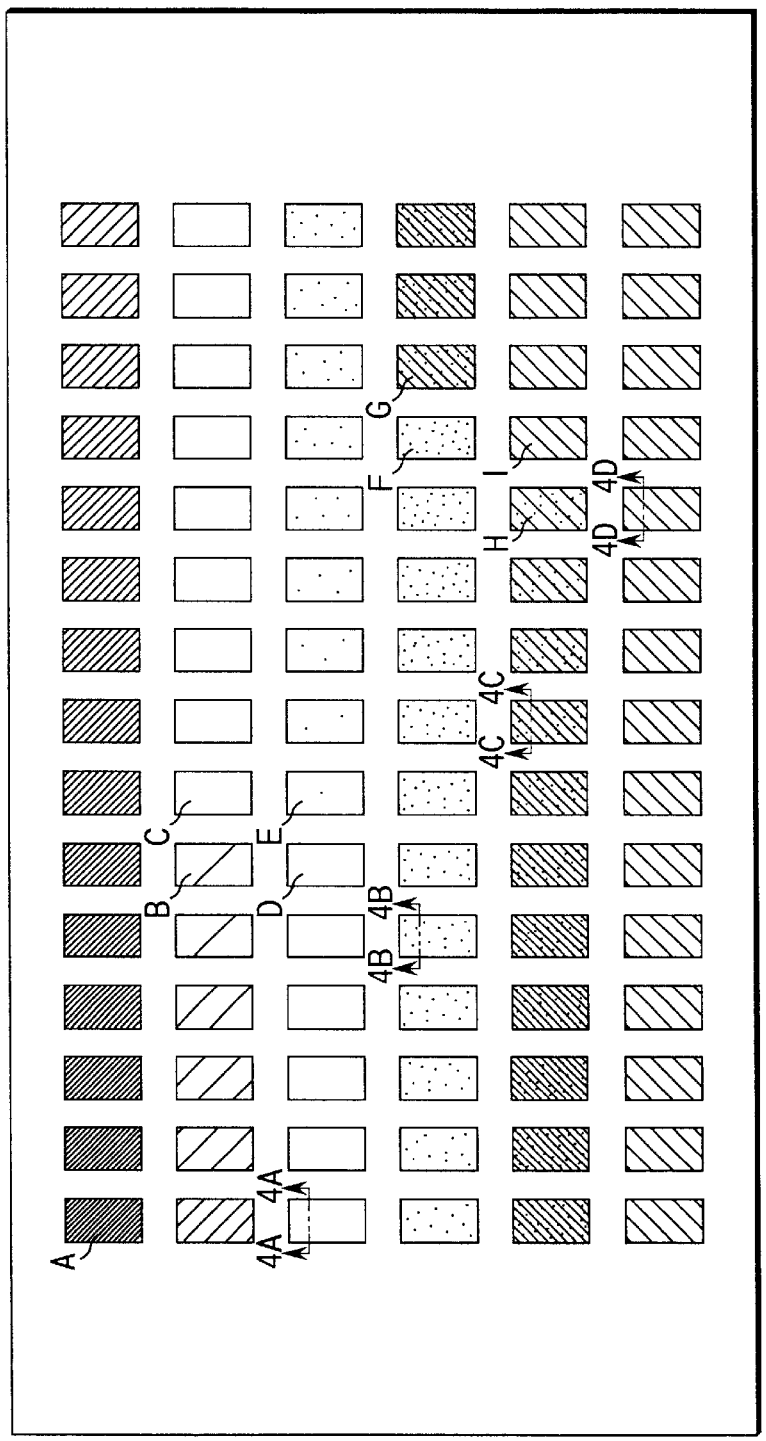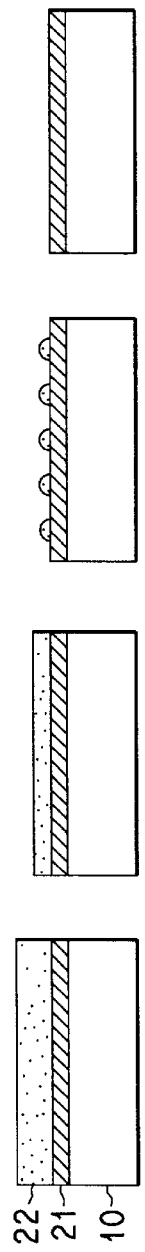
FIG. 3

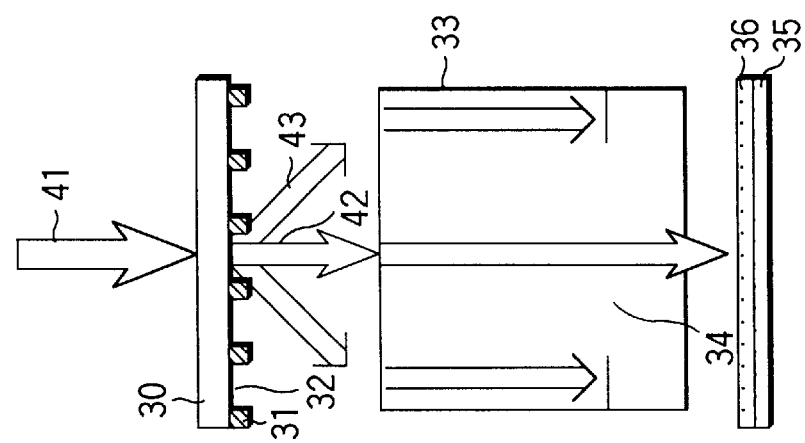
FIG. 8A FIG. 8B
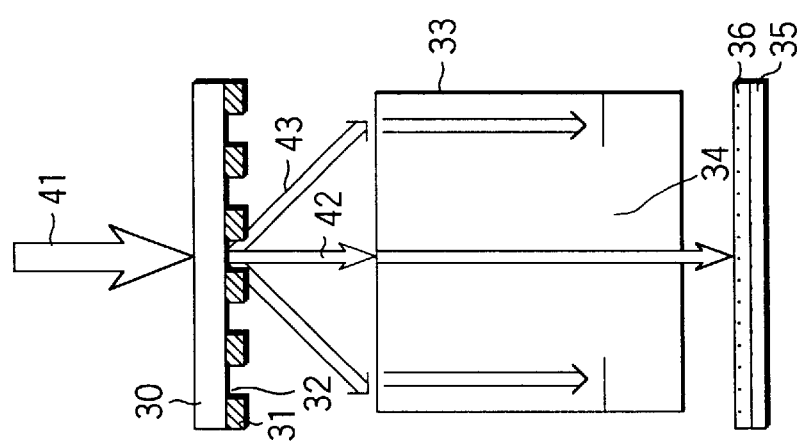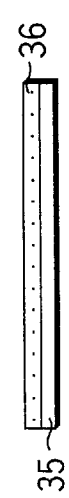
FIG. 9A FIG. 9B
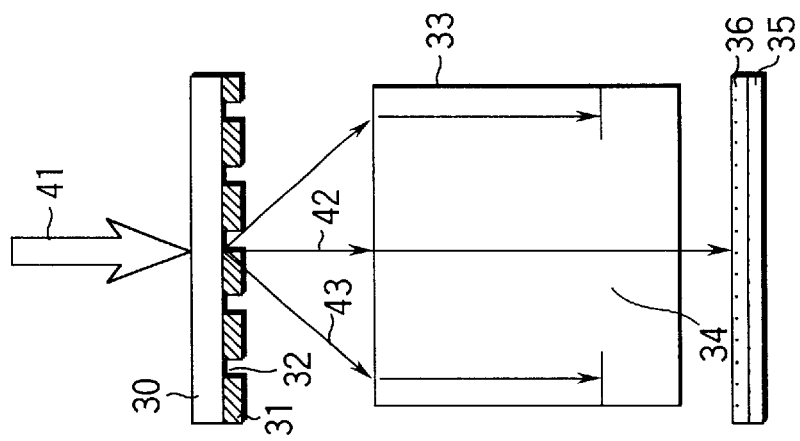
FIG. 10A FIG. 10B

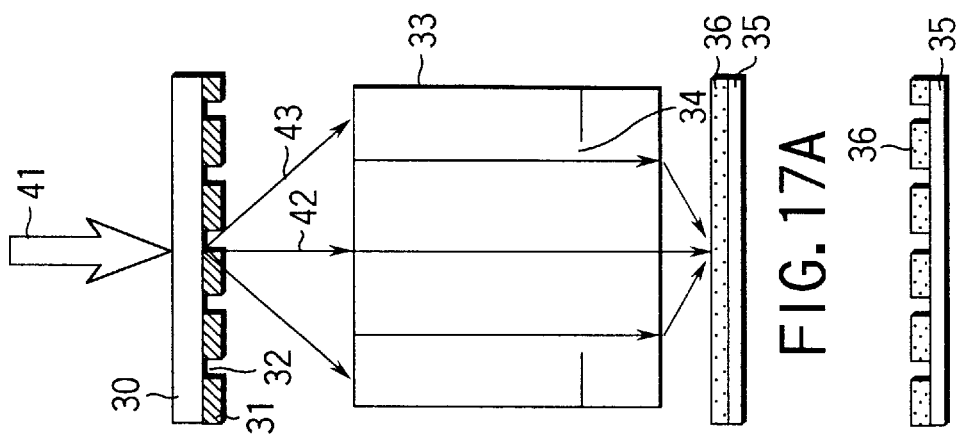
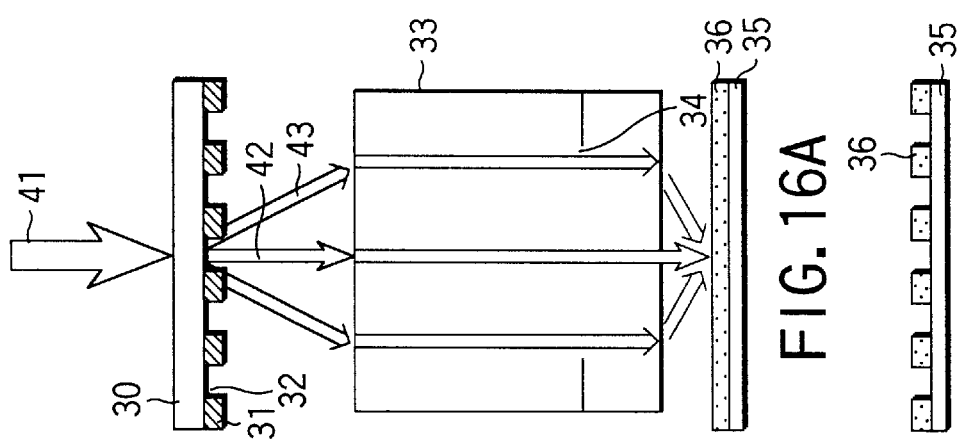
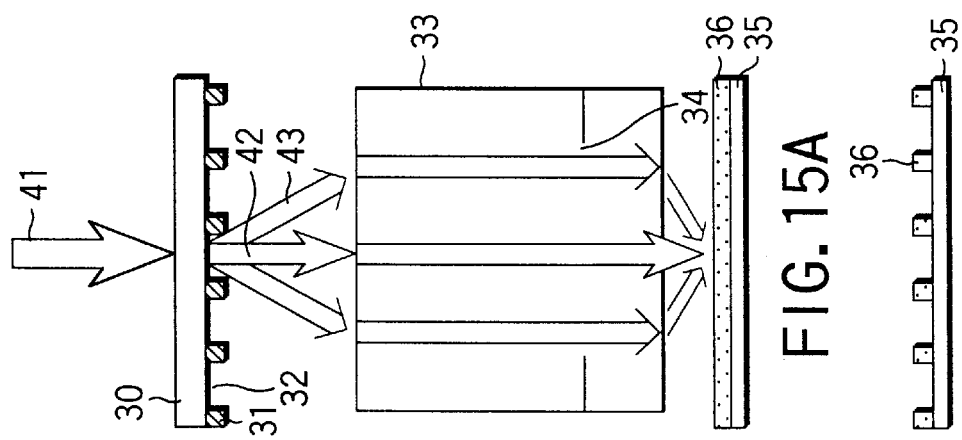

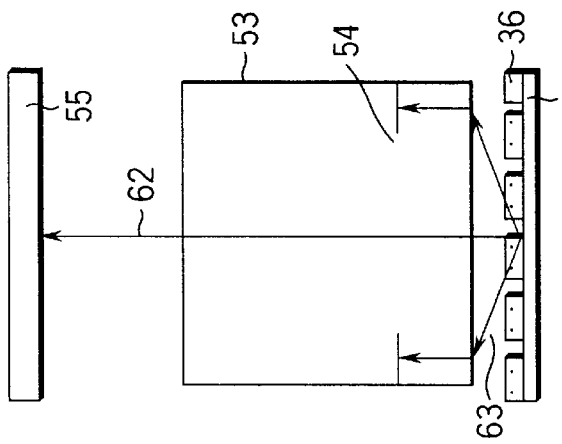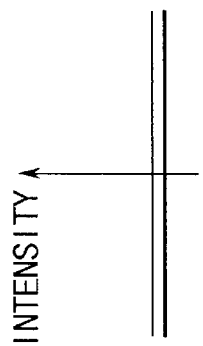
FIG. 20A / FIG. 20B
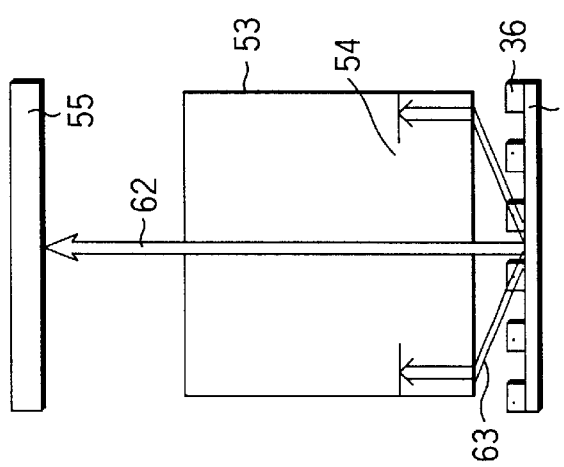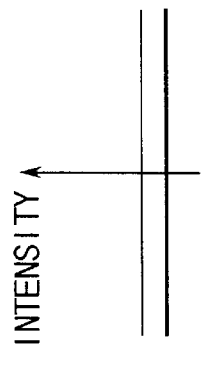
FIG. 19A / FIG. 19B
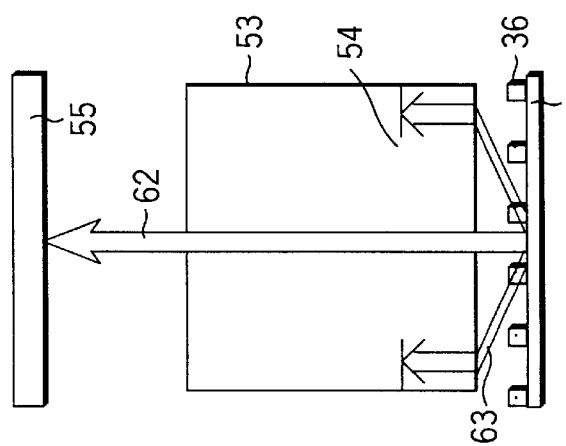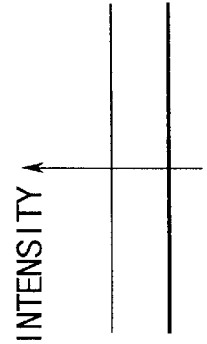
FIG. 18A / FIG. 18B

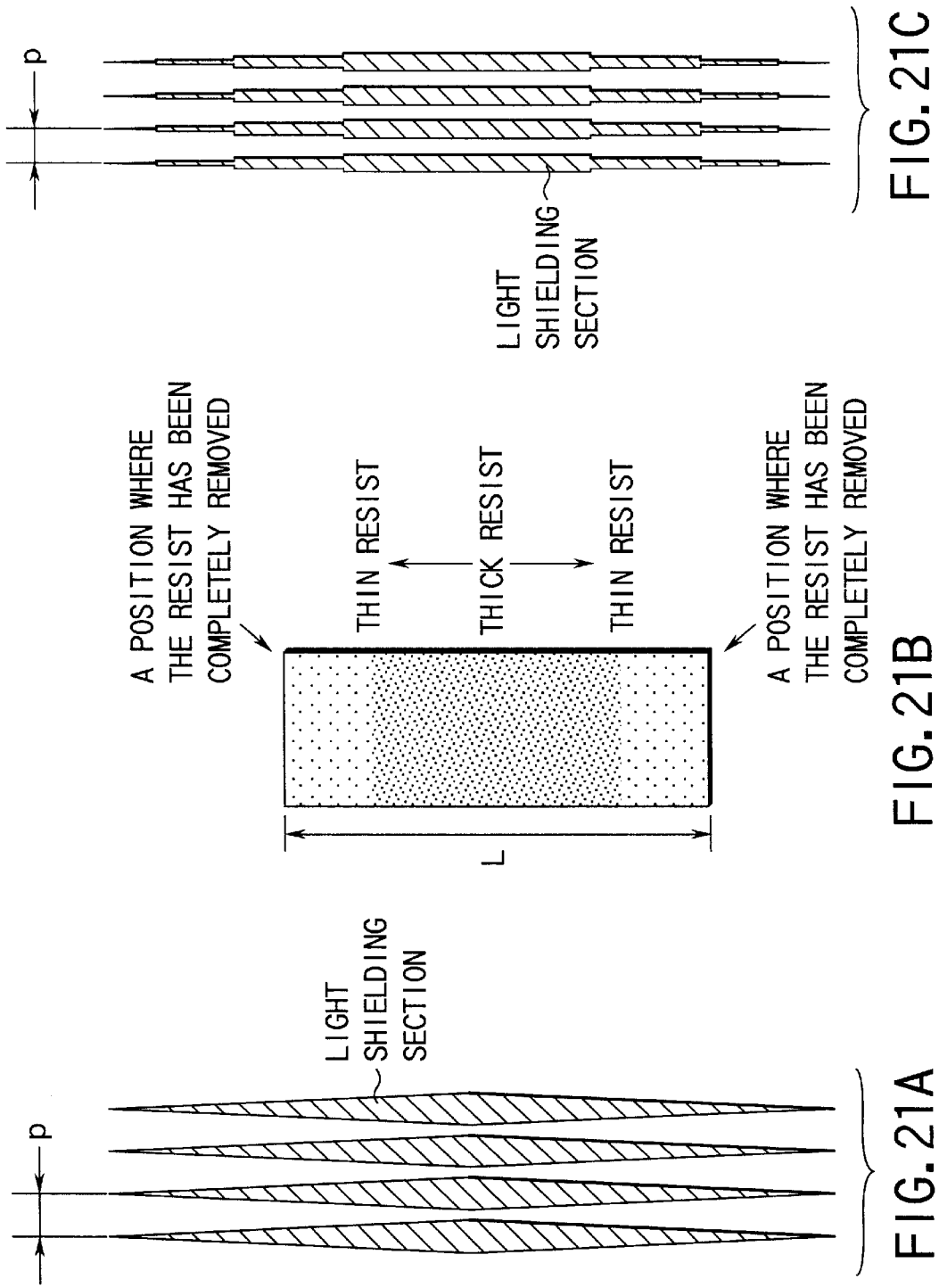

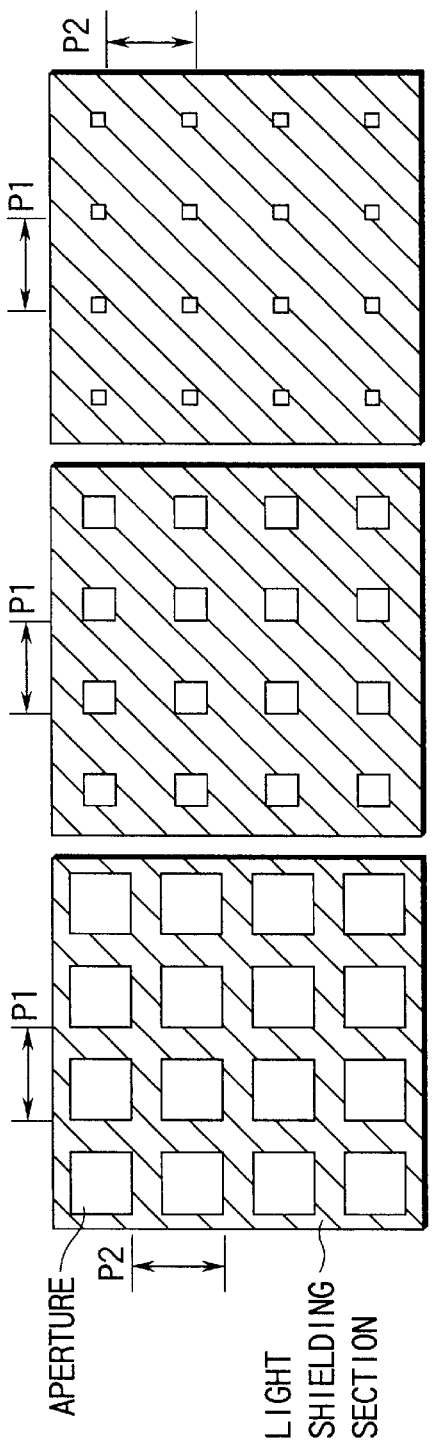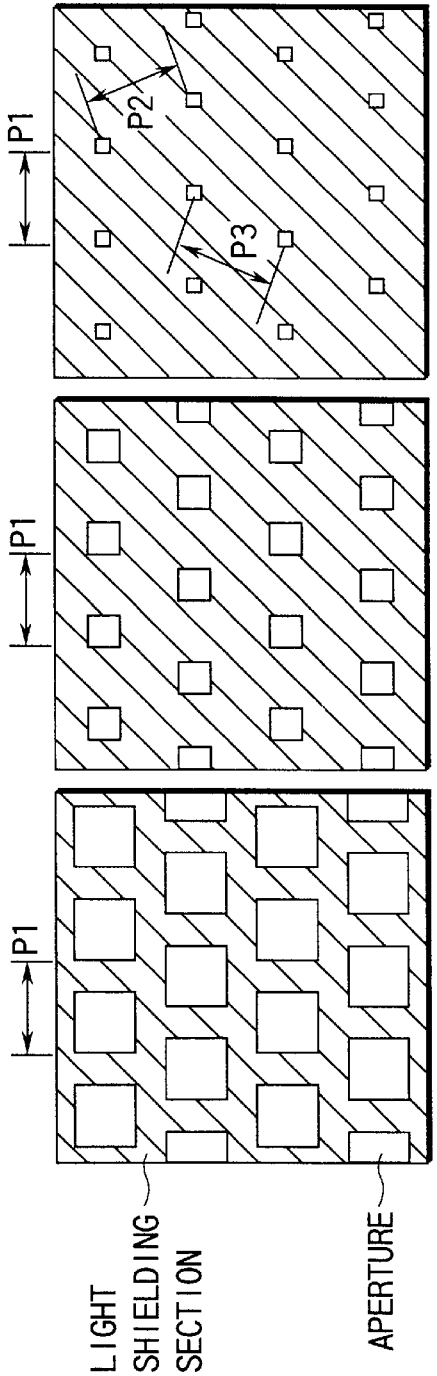

EXPOSURE DOSE MEASURING METHOD AND EXPOSURE DOSE MEASURING MASK

BACKGROUND OF THE INVENTION

The present invention relates to an effective exposure dose measuring technique in an exposure using a mask, and relates, more particularly, to an exposure dose measuring method for measuring an effective exposure dose in an optical lithography using a projection exposure apparatus, and an effective exposure dose measuring mask to be used therefor.

In recent years, a minimum size of an LSI has come closer to a resolution limit in an optical exposure apparatus and it has become impossible to obtain a sufficient process margin (depth of focus and dose latitude) for volume production in an optical lithography. In order to increase the process margin, various techniques have been employed such as a phase shift mask and a modified illumination.

In the mean time, in order to carry out an optical lithography with small process margin, a precise analysis of an error which consumes the process margin and an error budget have come to be attached with importance. For example, even if a large number of chip regions are exposed on a wafer with the same nominal exposure dose, an effective exposure dose varies because of non-uniformity of post exposure baking (PEB), development, resist thickness, and so on, in a wafer.

For measuring variations in the effective exposure dose onto a wafer plane, it has been a conventional practice that a pattern is printed onto a wafer plane by a nominal focus and a nominal exposure dose in an exposure apparatus at constant values, a size of the pattern is measured, and the pattern size is converted into an exposure dose, thereby to obtain an uniformity of the exposure dose inside the wafer plane. According to this method, however, it has been impossible to remove an effect of a subtle focus variation on a feature size. Further, an enormous time has been consumed for the measurement of the size.

As explained above, according to the conventional method of measuring an effective exposure dose inside a wafer plane, it is impossible to avoid an influence of focus variation since a pattern size is measured first and this pattern size is converted into an exposure dose, so that it has been difficult to accurately measure the exposure dose. There has also been a problem that it takes a long time for the measurement.

BRIEF SUMMARY OF THE INVENTION

The present invention has been made in consideration of the above situation, and it is an object of the present invention to provide an effective exposure dose measuring method for accurately measuring an effective exposure dose in a short time without an influence of focus variation, and an effective exposure dose measuring mask to be used therefor.

In order to solve the above-described problem, according to a first aspect of the present invention, there is provided an exposure dose measuring method for measuring an effective exposure dose on a wafer, comprising the steps of setting a mask formed with mask patterns each having light transmitting sections and light shielding sections repeated in a period p, a ratio of areas of the light transmitting sections to areas of the light shielding sections of each of the mask patterns being different from ratios of those of the others of the mask patterns, to a projection exposure apparatus ha light wavelength $\lambda$, a numerical aperture NA at a wafer side, an illumination coherence factor $\delta$ and a mask pattern magnification M for patterns to be formed on the wafer; exposing light through the mask patterns of the mask onto a resist coated on the wafer; and observing a state of exposed portions of the resist on the wafer corresponding to the mask patterns, wherein the period p is set so as to satisfy a relationship of $$p/M \leq \lambda/(1+\delta)NA.$$

In a light exposure measuring method according to the first aspect of the present invention, an area of a light transmitting section of a mask pattern which corresponds to a portion of the wafer where a corresponding portion of the resist has been removed, may be measured, and the measured area may be converted into an effective exposure dose.

In a light exposure measuring method according to the first aspect of the present invention, an area of a light transmitting section of a mask pattern which corresponds to a portion of the wafer where a corresponding portion of the resist has become a predetermined film thickness, may be measured, and the measured area may be converted into an exposure dose.

In a light exposure measuring method according to the first aspect of the present invention, the mask patterns may be a plurality of kinds of patterns of lines-and-spaces.

In a light exposure measuring method according to the first aspect of the present invention, the mask patterns may be a plurality of kinds of patterns of repeated holes.

In a light exposure measuring method according to the first aspect of the present invention, the mask patterns may be a plurality of kinds of patterns of repeated rhombuses.

In a light exposure measuring method according to the first aspect of the present invention, the mask patterns may be set so as to have a constant change quantity in the area of a light transmitting section.

In a light exposure measuring method according to the first aspect of the present invention, the mask patterns may be set so as to have a constant change rate in the area of a light transmitting section.

In order to solve the above-described problem, according to a second aspect of the present invention, an exposure dose measuring method for measuring an effective exposure dose on a wafer, comprising the steps of setting a mask formed with mask patterns each having light transmitting sections and light shielding sections repeated in a period p, a ratio of areas of the light transmitting sections to areas of the light shielding sections of each of the mask patterns being different from ratios of those of the others of the mask patterns, to a projection exposure apparatus having an exposure light wavelength $\lambda$, a numerical aperture NA at a wafer side, an illumination coherence factor $\delta$ and a mask pattern magnification M for patterns to be formed on the wafer; exposing light through the mask patterns of the mask onto a resist coated on the wafer; and observing a pattern on the wafer corresponding to the mask patterns, with an optical microscope having a wavelength $\lambda_m$, a numerical aperture $NA_m$ at a wafer side, and an illumination coherence factor $\delta_m$, wherein the period p is set so as to satisfy relationships of $$p/M > \lambda/(1+\delta)NA$$

and $$p/M \leq \lambda_m/(1+\delta_m)NA_m.$$

In a light exposure measuring method according to the second aspect of the present invention, an area of a light transmitting section of a mask pattern which corresponds to a portion of an imaging plane of the optical microscope where the intensity of the exposure has become a predetermined value, may be measured, and the measured area may be converted into an effective exposure dose.

In a light exposure measuring method according to the second aspect of the present invention, the mask patterns may be a plurality of kinds of patterns of lines-and-spaces.

In a light exposure measuring method according to the second aspect of the present invention, the mask patterns may be a plurality of kinds of patterns of repeated holes.

In a light exposure measuring method according to the second aspect of the present invention, the mask patterns may be a plurality of kinds of patterns of repeated rhombuses.

In a light exposure measuring method according to the second aspect of the present invention, the mask patterns may be set so as to have a constant change quantity in the area of a light transmitting section.

In a light exposure measuring method according to the second aspect of the present invention, the mask patterns may be set so as to have a constant change rate in the area of a light transmitting section.

In order to solve the above-described problem, according to a third aspect of the present invention, there is provided an exposure dose measuring mask to be used for a measurement of an exposure dose, the mask having mask patterns on a substrate, through which an exposure light is exposed onto a resist coated on a wafer to measure an effective exposure dose on the wafer, wherein the mask patterns each have light transmitting sections and light shielding sections are repeated in a period p, a ratio of areas of the light transmitting sections to areas of the light shielding sections of each of the mask patterns differs from ratios of those of the others of the mask patterns, and the period p is set so as to satisfy a relationship of $p/M \leq \lambda/(1+\delta)NA$, where an exposure light wavelength at the time of exposing the mask patterns is $\lambda$, a numerical aperture at a wafer side is NA, an illumination coherence factor is $\delta$, and a mask pattern magnification for patterns to be formed on the wafer is M.

In order to solve the above-described problem, according to a fourth aspect of the present invention, there is provided an exposure dose measuring mask to be used for a measurement of an exposure dose, the mask having mask patterns on a substrate, through which an exposure light is exposed onto a resist coated on a wafer to measure an effective exposure dose on the wafer, wherein the mask patterns each have light transmitting sections and light shielding sections are repeated in a period p, a ratio of areas of the light transmitting sections to areas of the light shielding sections of each of the mask patterns differs from ratios of those of the others of the mask patterns, and the period p is set so as to satisfy relationships of $p/M > \lambda/(1+\delta)NA$, and $p/M \leq \lambda_m/(1+\delta_m)NA_m$ where an exposure light wavelength at the time of exposing the mask patterns is $\lambda$, a numerical aperture at a wafer side is NA, an illumination coherence factor is $\delta$, and a mask pattern magnification for pattern to be formed on the wafer is M, and when an optical microscope for measuring the patterns on the wafer corresponding to the mask patterns has a wavelength $\lambda_m$, a numerical aperture at a wafer side $NA_m$, and an illumination coherence factor $\delta_m$.

According to the present invention, a mask including a plurality of repetition patterns with subtle changes in the area ratio (duty ratio) of open areas to shielding areas is exposed on a wafer with a projection exposure apparatus, and the wafer is developed. In this case, when the repetition period p of the light transmitting sections and the light shielding sections is set as described in the invention according to the first aspect and the invention according to the third aspect, diffraction beams (± first order and higher order diffraction beams) from the mask patterns do not pass through the pupil of the projection lens and only straight beams (diffraction beams of zero order) pass through the pupil. In other words, the pitch of the mask patterns has to be a resolution limit or below. When the pitch of mask patterns is at or below the resolution limit, these patterns are not resolved and flat exposures are carried out with different light exposure doses reaching on the wafer plane according to the duty ratio. As a result, remaining resist thicknesses change according to the duty ratio even if the setting exposure dose of the projection exposure apparatus is uniform.

Therefore, by grasping the area where the resist has been completely removed with an optical microscope, and by making this area correspond to the duty ratio of the formed mask patterns, an effective exposure dose can be seen. Further, by printing a plurality of repetition patterns of subtle differences in duty ratios onto the whole surface of the wafer, it is possible to see variations in effective exposure dose inside the wafer.

In this case, since the mask patterns are not resolved, it becomes possible to completely eliminate the influence of focus variation. Further, since it is necessary to identify only a portion from which the resist has been removed completely, this portion can be observed sufficiently with an optical microscope of a low magnification. Therefore, it is possible to accurately measure the effective exposure dose in a short time and at low cost.

When the repetition period p of the light transmitting sections and the light shielding sections is set as described in the invention according to the second aspect and the invention according to the fourth aspect, mask patterns are resolved at the time of an exposure but are not resolved at the time of a detection. Therefore, it is possible to see variations in effective exposure dose inside the wafer in a similar manner to the above.

In this case, although mask patterns are resolved on the wafer, it is possible to make the mask patterns to be less subjected to the influence of a subtle focus variation since the pattern size is large. Further, a high-precision mask is not required, and a mask of normal precision can sufficiently achieve the resolution for a variation of effective exposure dose. Furthermore, since the measurement can be carried out with an optical microscope of a low magnification with a low resolving power for not resolving patterns on the wafer, it is possible to perform an accurate measurement of light exposure in a short time and at low cost.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a microscopic image of a pattern on an exposed wafer in the first embodiment of the present invention;

FIGS. 4A, 4B, 4C and 4D are cross sectional views of the blocks of the pattern shown in FIG. 3;

FIGS. 8A, 9A and 10A are views for showing the operation of the first embodiment of the present invention, in which a mask of a plurality of L/S having a same pitch and having different ratios of space width S to line width L (duty ratio) is shown;

FIGS. 8B, 9B and 10B are cross sectional views showing the states of the resist, respectively in correspondence to FIGS. 8A, 9A and 10A, in which the removal of the resist changes according to the duty ratio;

FIGS. 15A, 16A and 17A are views for showing the operation of the second embodiment of the present invention, in which a mask of a plurality of L/S having a same pitch and having different ratios of space width S to line width L (duty ratio) is shown;

FIGS. 15B, 16B and 17B are cross sectional views showing the patterns of the resist, respectively in correspondence to FIGS. 15A, 16A and 17A, in which the removal of the resist changes according to the duty ratio;

FIGS. 18A, 19A and 20A are views for showing the operation of the second embodiment of the present invention, in which a mask of a plurality of L/S having a same pitch and having different ratios of space width S to line width L (duty ratio) is shown;

FIGS. 18B, 19B and 20B show intensities on the photo-detector plane, respectively in correspondence to FIGS. 18A, 19A and 20A, in which the intensities change according to the duty ratio;

FIG. 21A is a view for showing another example of mask pattern (a rhombus pattern) that can be used in the first and second embodiments of the present invention;

FIG. 21B shows a removal state of the resist obtained by using the mask pattern of FIG. 21A;

FIG. 21C is a view for showing a further example of mask pattern (a rhombus pattern) that can be used in the first and second embodiments of the present invention;

FIGS. 22A, 23A and 24A are views for showing other examples of pattern (a repetition hole pattern) that can be used in the first and second embodiments of the present invention;

FIGS. 22B, 23B and 24B are views for showing further examples of pattern (a repetition hole pattern) that can be used in the first and second embodiments of the present invention;

DETAILED DESCRIPTION OF THE INVENTION

Embodiments of the present invention will be explained in detail next with reference to the drawings.

(First Embodiment)

A first embodiment of the present invention will be explained with reference to FIGS. 1A, 1B, 2, 3, 4A, 4B, 4C, 4D, 5, 6, and 7. In the present embodiment, there is used a mask of a plurality of line-and-space patterns (L/S) having a same pitch and having different ratios of space width to line width (duty ratio). Unless otherwise specified, sizes on the mask will be shown as sizes on the wafer by conversion.

Figure 1A:
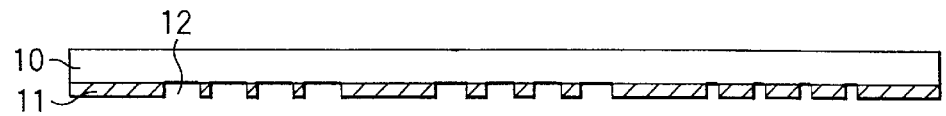
FIGS. 1A and 1B show a cross-sectional view and a plan view, respectively, of a concept of a mask pattern used in a first embodiment of the present invention.
Figure 1B:
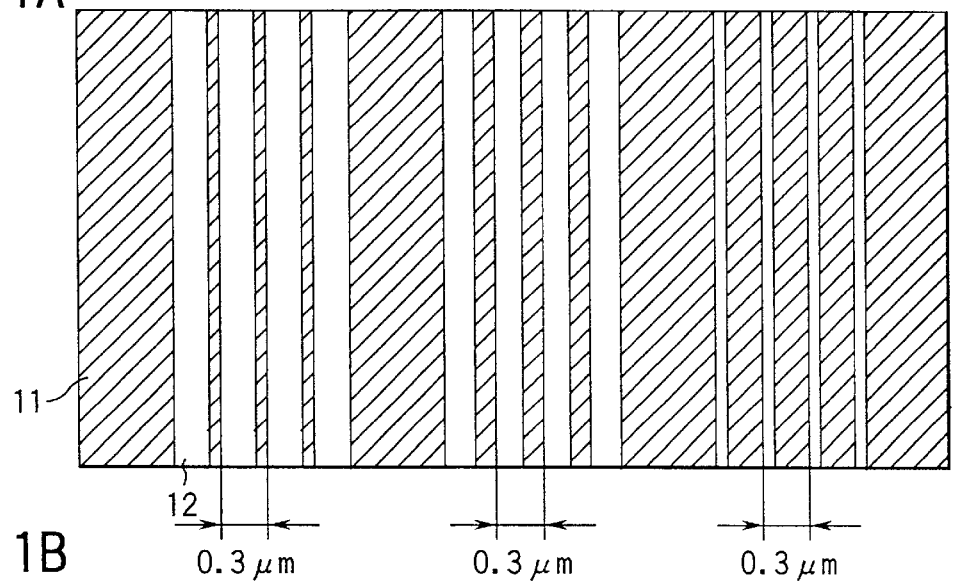

FIGS. 1A and 1B are a plan view and a cross-sectional view, respectively, for showing a concept of mask patterns used in the present embodiment. The mask used is a Cr mask having pitches of 0.3 μm at wafer dimension and a magnification of four times. In the figures, 10 denotes a transparent substrate, 11 a Cr (a light shielding section), and 12 a space (a light transmitting section). The size of the space is changed at every 0.625 nm at wafer dimension.

Figure 2:
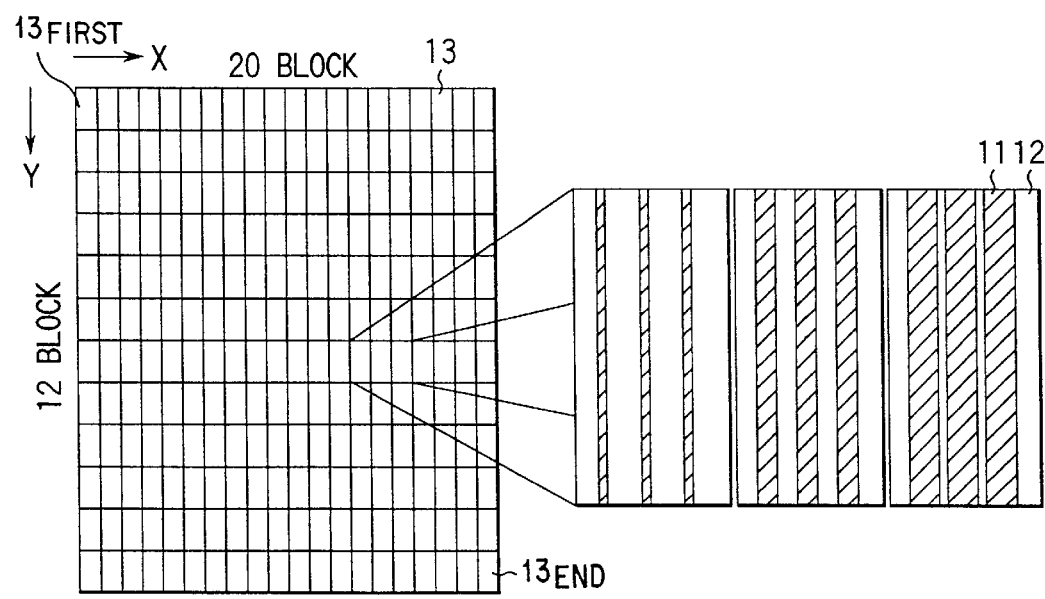
FIG. 2 is a plan view for showing a mask actually used in the first embodiment of the present invention, in which three blocks are shown in an enlargement manner.

FIG. 2 shows a layout of mask patterns actually used. The mask patterns is comprised of 240 blocks in total, 20 blocks in the X direction and 12 blocks in the Y direction. L/S of one kind of duty ratio is disposed in one block. A block $13_{first}$ on the left top of the figure has a minimum space size and a block $13_{end}$ at the right bottom has a maximum space size. The block layout as shown in FIG. 2 is used so that this can be accommodated within a field of vision of an optical microscope with a low magnification, as described later. In the figure, three blocks are shown in an enlargement manner.

At first, a send ahead exposure was carried out by using the above mask. On a silicon wafer, a coating-type anti-reflective film in a thickness of 60 nm was formed by spin coating, and further, a chemical amplification positive-type resist having a sensitivity of 15 mJ/cm² was spin coated in a thickness of 0.4 μm. Thereafter, a pre-baking was carried out at 100° C. for 90 seconds. The series of processing were executed on a track connected to a projection exposure apparatus.

The wafer finished with these processings was carried to the projection exposure apparatus, and the mask was exposed. A reduction ratio of a projection optical system was ¼, an exposure wavelength was 248 nm, an NA was 0.6, and an illumination coherence factor δ was 0.3. A set exposure of the projection exposure apparatus was increased from 5 mJ/cm² to 25 mJ/cm² at every 0.2 mJ/cm².

The wafer after finishing the exposure was carried onto the track again, and was then post-baked (PEB) at 100° C. for 90 seconds. Thereafter, the wafer was developed for 60 seconds in an alkali developing solution of 0.21 prescription. A pattern on the wafer processed in this way was observed with the optical microscope. FIG. 3 shows a microscopic image of a light exposure 7.5 mJ/cm². FIG. 3 schematically shows a part of a printed image on the wafer of the mask pattern shown in FIG. 2. Each one square shown by A, B, C, . . . in FIG. 3 corresponds to one block shown in FIG. 2. FIGS. 4A, 4B, 4C and 4D show enlarged cross sections of the blocks shown in FIG. 3. In FIGS. 4A, 4B, 4C and 4D, an anti-reflective film 21 is formed on the wafer 10, and a resist film 22 is formed on the anti-reflective film 21. From FIGS. 4A, 4B, 4C and 4D, it can be known that the thickness of the resist film 22 formed on the anti-reflective film 21 decreases according to the space width of the L/S.

In FIG. 3, in the microscope, the squares are observed in a gradually increasing level of brightness because of the influence of interference, as the resist becomes gradually thinner from region A to region B. Squares are observed as almost constant-level images from region C to region D (FIG. 4A). From region E (FIG. 4B), the color of the substrate under the resist starts to be observed transparently, and the color gradually changes from this region to region F. Further, from region G (FIG. 4C), the substrate starts to be exposed, and non-uniform colors are observed to region H due to the influence of the resist residue. From region I (FIG. 4D), the substrate color is observed straight in a uniform color since the resist is completely removed from this region I. By using this microscope, it was possible to easily recognize the region I as a position where the resist has been completely removed.

Figure 5:
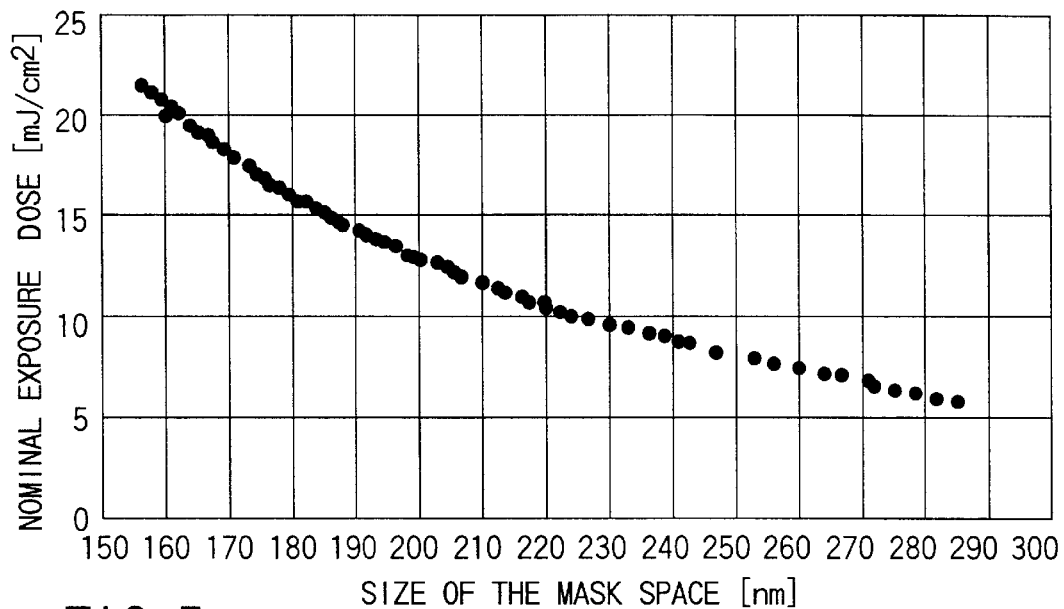
FIG. 5 is a diagram for showing a relationship between a mask space size and a nominal exposure dose, obtained in the first embodiment of the present invention.
Figure 6:
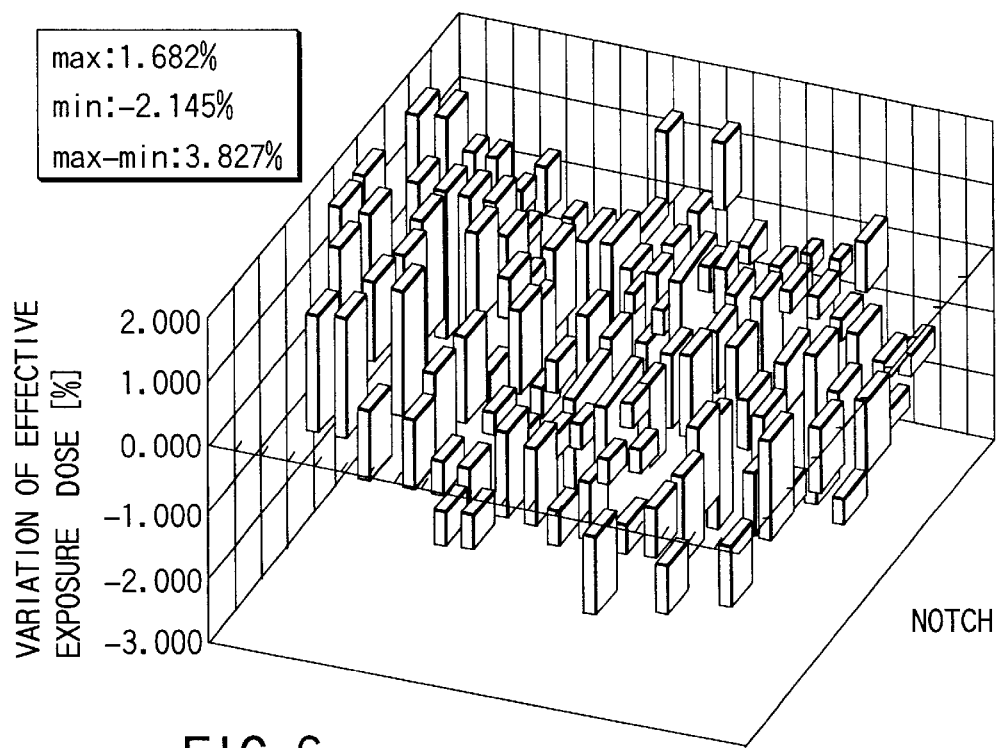
FIG. 6 is a diagram three-dimensionally showing variation of an effective exposure dose, used for explaining the effect of the first embodiment of the present invention.
Figure 7:
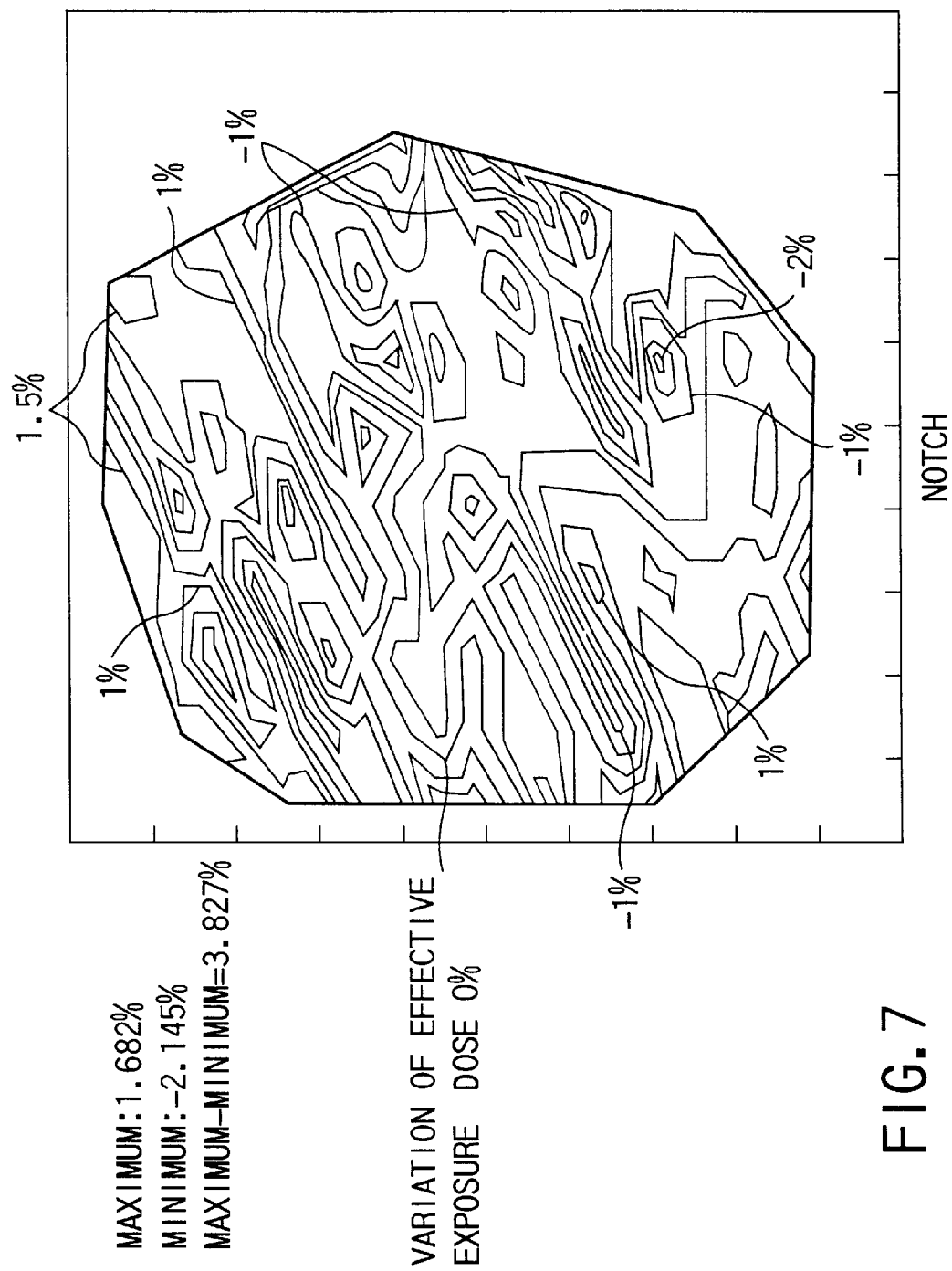
FIG. 7 is a diagram showing the variation of the effective exposure dose in contour lines, used for explaining the effect of the first embodiment of the present invention.

FIG. 5 shows a relationship between a mask space width corresponding to a position where the resist has been removed and a nominal exposure dose of the projection exposure apparatus. It can be seen that the sensitivity to the change of the exposure dose is higher when the space width of the mask is larger. In other words, when the exposure is carried out by setting the light exposure to about 7.5 mJ/cm², the space width of the mask corresponding to a position where the resist can be completely removed changes in good sensitivity, corresponding to the variation of effective exposure dose attributable to the non-uniformity of PEB, development, resist thickness, and so on, inside the wafer plane.

Next, an exposure was carried out for measuring a variation of an effective exposure dose inside the wafer plane. The nominal exposure dose of the projection exposure apparatus was set to 7.5 mJ/cm² for the above reason. Other conditions are the same as those of the above send ahead exposure. The mask patterns of FIG. 2 were printed into the wafer plane, positions where the resist has been removed were measured with the optical microscope, and space widths of the corresponding L/S were obtained. These were converted into the effective exposure dose according to FIG. 5. A result obtained is shown in a three-dimensional display in FIG. 6, and is also shown in contour lines in FIG. 7. It can be seen that, with the notches set at the bottom, the upper side of the wafer has the exposure dose effectively higher by about 2%. It can also be seen that the variation in the effective exposure dose inside the wafer plane is about 3.8%.

The operation of the present embodiment will be explained next with reference to FIGS. 8A, 8B, 9A, 9B, 10A, and 10B. In the figures, 30 denotes a transparent substrate, 31 a light shielding section, 32 a light transmitting section, 33 a projection lens, 34 a pupil, 35 a wafer, 36 a resist, 41 an exposure beam, 42 a straight beam (a 0-th order diffraction beam), and 43 a diffraction beam (± first order diffraction beam).

As shown in FIGS. 8A, 9A, and 10A, there is considered a mask of a plurality of L/S having a same pitch and having different ratios of space width S to line width L (duty ratio). When these mask patterns are illuminated, the ± first order diffraction beam 43 is diffracted at the same angle since the diffraction angle is determined by the pitch p. In this case, the pitch is so determined that the ± first order diffraction beam 43 does not pass through the pupil 34 of the projection lens 33. Then, since only the 0-th order diffraction beam 42 passes through the projection lens 33, no pattern is formed on the wafer 35, and only the 0-th order diffraction beam 42 is irradiated.

Figure 11A:
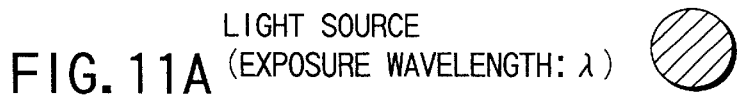
FIGS. 11A, 11B and 11C are views for explaining a mask pattern designing used in the first embodiment of the present invention, and show a light source, a mask, and a pupil, respectively.
Figure 11B:
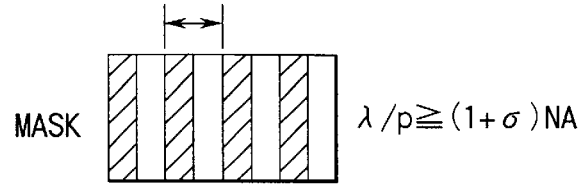
Figure 11C:
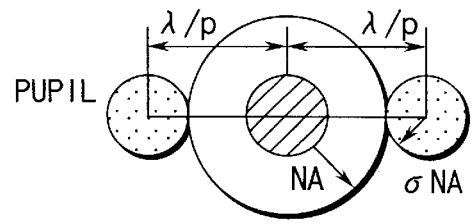

A more detailed mask pattern design will be explained with reference to FIGS. 11A, 11B and 11C. FIGS. 11A, 11B and 11C show a relationship among a numerical aperture NA at a wafer side, an exposure wavelength λ, an illumination coherence factor δ and a pitch p of the L/S of a projection optical system of the projection exposure apparatus. From these figures, it can be seen that the pitch p at wafer dimension that does not permit the ± first order diffraction beam to pass through the pupil of the projection lens needs to satisfy the following expression when the light source size (coherence factor) is taken into account:

$$p \leq \lambda/(1+\delta)NA \quad \text{(Expression 1)}$$

When λ=248 nm, NA=0.6 and δ=0.3, for example, then p≤0.318 μm. Therefore, it is reasonable to have the pitch set to 0.3 μm in the present embodiment.

Next, consider a case where the duty ratios of the L/S on the mask are different. When the duty ratios of the L/S on the mask are different, the quantity of light passing through the mask patterns and the distribution ratio of the 0-th order diffraction beam and the first order diffraction beam change respectively as shown in FIGS. 8A, 9A, and 10A. As a result, the intensity of the 0-th order diffraction beam changes depending on the duty ratio of the L/S on the mask. In other words, the L/S with different duty ratios achieve a function equivalent to that of a film having different transmittances. Accordingly, when an exposure is carried out by using this mask, the removal of the resist changes according to the duty ratio as shown in FIGS. 8B, 9B, and 10B.

Quantitatively, the square of a ratio of space widths in the L/S of two kinds of duty ratios is proportional to the ratio of intensity of the 0-th order diffraction beam. In other words, the resolution of the present embodiment in the variation of effective exposure dose is the square of the ratio of the space widths in the L/S of two kinds of duty ratios for the space widths of the closest sizes. Since the L/S mask used in the present embodiment has the space widths changed at every 0.625 nm at wafer dimension, the sensitivity at the space width 260 nm at wafer dimension corresponding to a position near the light exposure 7.5 mJ/cm² becomes as follows:

$$(260.625/260)^2 = 1.00481$$

Thus, it can be seen that the resolution is about 0.48% in this case.

In the present embodiment, as the repetition pitch p between the light transmitting section and the light shielding sections in the mask patterns is set as shown by the Expression 1 thereby to avoid resolution of the mask patterns, it becomes possible to completely eliminate the influence of focus variation. Further, since it is necessary to find only a portion from which the resist has been removed, this portion can be find sufficiently with an optical microscope with a low magnification. Therefore, it is possible to accurately measure the effective exposure dose in a short time and at low cost. In other words, it becomes possible to accurately measure the effective exposure dose in a short time without any influence of focus variation.

(Second Embodiment)

A second embodiment of the present invention will be explained next with reference to FIGS. 12A, 12B, 13 and 14. The method of the present embodiment is the same as that of the first embodiment in that a mask of a plurality of L/S having a same pitch and having different ratios of space width to line width (duty ratios) is used, except that the pitch is set at a larger value of 2.6 µm. While the exposure is carried out under the condition that mask patterns are not transferred onto the wafer in the first embodiment, the present embodiment is characterized in that mask patterns are transferred onto the wafer and observation is carried out with an optical microscope under the condition that these patterns on the wafer are not resolved.

Figures 12A, 12B:
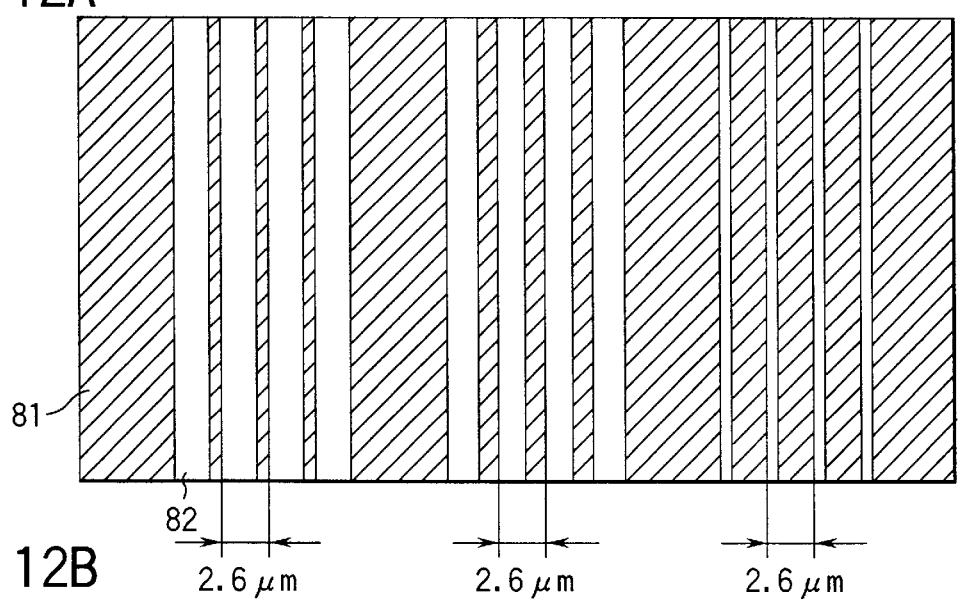
FIGS. 12A and 12B show a cross-sectional view and a plan view, respectively, of a concept of a mask pattern used in a second embodiment of the present invention.

FIGS. 12A and 12B are a plan view and a cross-sectional view, respectively, for showing a concept of mask patterns used in the present embodiment. The mask used is a Cr mask having pitches of 2.6 µm at wafer dimension and a magnification of four times. In the figures, 80 denotes a transparent substrate, 81 a Cr, and 82 a space. The size of the space is changed at every 0.625 nm at wafer dimension.

Figure 13:
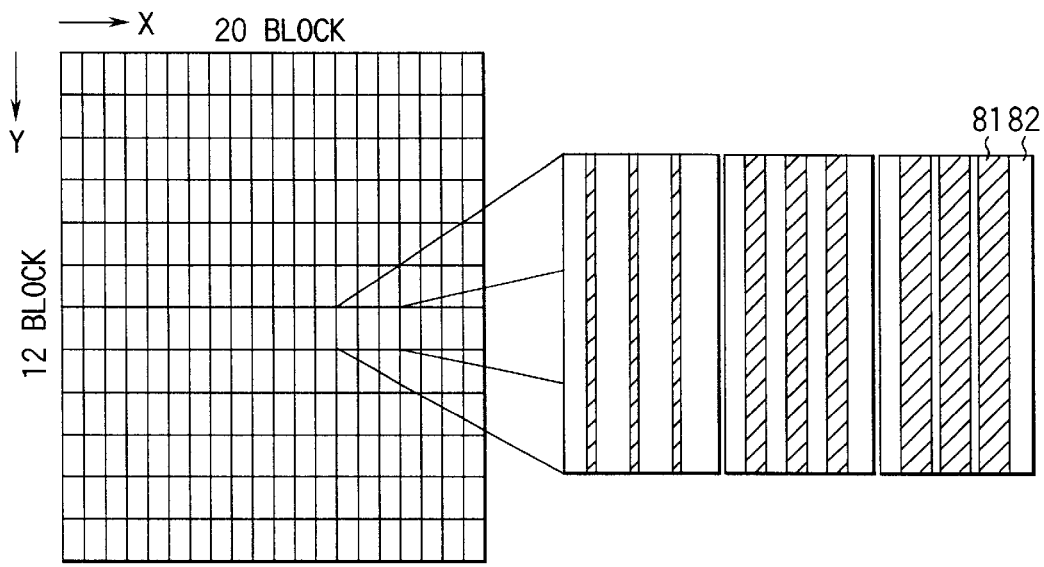
FIG. 13 is a plan view for showing a mask actually used in the second embodiment of the present invention, in which three blocks are shown in an enlargement manner.

FIG. 13 shows a layout of mask patterns actually used. The mask is comprised of 240 blocks in total, 20 blocks in the X direction and 12 blocks in the Y direction. L/S of one kind of duty ratio is disposed in one block. The block layout as shown in FIG. 13 is used so that this can be accommodated within a field of vision of an optical microscope with a low magnification, as described later. In the figure, three blocks are shown in an enlargement manner.

At first, a send ahead exposure was carried out by using the above mask. The exposure was carried out in a similar manner to the first embodiment except that the coherence factor δ of the light exposure apparatus at the time of the conditioning exposure is 0.75.

Figure 14:
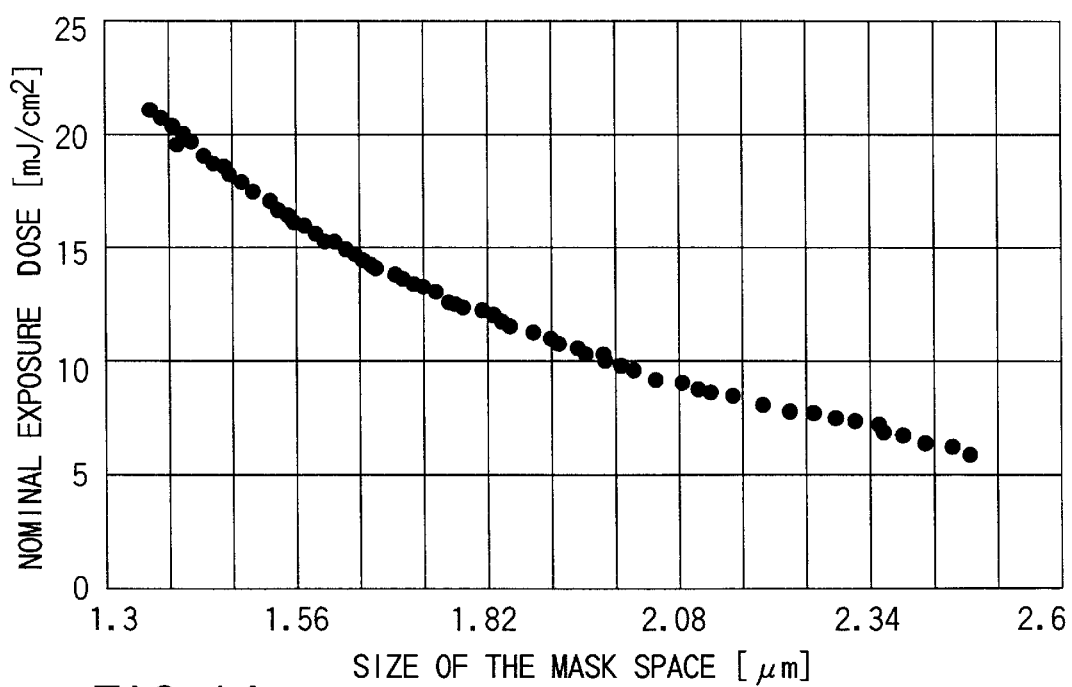
FIG. 14 is a diagram showing a relationship between a mask space size and a nominal exposure dose, obtained in the second embodiment of the present invention.

Patterns on the wafer processed in this way were observed with the optical microscope. This optical microscope has an NA of 0.12 for its objective lens, a wavelength of 550 nm and the coherence factor a of 0.7. The patterns are not resolved under these conditions, and a detected image showed a constant intensity corresponding to the 0-th order diffraction beam. A relationship between a nominal exposure dose of the projection exposure apparatus at which the intensity becomes a predetermined value and a mask space width is shown in FIG. 14. It can be seen that the sensitivity to the change of the exposure dose is higher when the mask space width is larger. In other words, when the exposure is carried out by setting the nominal exposure dose to about 7.5 mJ/cm², the width of the mask space corresponding to a position where the intensity of an image detected by the microscope becomes a predetermined value changes in good sensitivity, corresponding to the variation of effective exposure dose attributable to the non-uniformity of PEB, development, resist thickness, and so on, inside the wafer plane.

Next, an exposure was carried out for measuring a variation of an effective exposure dose inside the wafer plane. The nominal exposure dose of the projection exposure apparatus was set to 7.5 mJ/cm² for the above reason. Other conditions are the same as those of the above send ahead exposure. The mask patterns of FIG. 13 were printed into the wafer plane, positions where the intensity becomes a predetermined value were measured with the optical microscope, and space widths of the corresponding L/S were obtained. These were converted into the effective exposure dose according to FIG. 14. A result obtained is the same as that shown in FIG. 5. It can be seen that, with the notches set at the bottom, the upper side of the wafer has the exposure dose effectively higher by about 2%. It can be also seen that the variation in the effective exposure dose inside the wafer plane is about 3.8%.

The operation of the present embodiment will be explained next with reference to FIGS. 15A, 15B, 16A, 16B, 17A, 17B, 18A, 18B, 19A, 19B, 20A, and 20B. There is considered a mask of a plurality of L/S having a same pitch and having different ratios of space width S to line width L (duty ratio). When these mask patterns are illuminated, any pattern is diffracted at the same angle since the diffraction angle is determined by the pitch p as shown in FIGS. 15A, 16A, and 17A. In the present embodiment, the pitch is so determined that at least the ± first order diffraction beam 43 passes through the pupil 34 of the projection lens 33. The condition in this case is different from that of the Expression 1, and is expressed as follows:

$$p > \lambda/(1+\delta)NA \quad \text{(Expression 2)}$$

Then, the resist patterns 36 are formed on the wafer 35 as shown in FIGS. 15B, 16B, and 17B.

Next, the patterns on the wafer are observed with the optical microscope. In this case, the observation is carried out under the condition that t the L/S formed on the wafer are not resolved.

As shown in FIGS. 18A, 19A, and 20A, there is considered a mask of a plurality of L/S having a same pitch and having different ratios of space width S to line width L (duty ratio). When these patterns on the wafer are illuminated, the ± first order diffraction beam 63 is diffracted at the same angle since the diffraction angle is determined by the pitch p. In this case, the pitch is so determined that the ± first order diffraction beam 63 does not pass through a pupil 54 of an objective lens 53. Then, since only a 0-th order diffraction beam 62 passes through the objective lens 53, the first order diffraction beam 63 is not incident to a photo-detector 55 of the optical microscope, and only the 0-th order diffraction beam 62 is incident to the photo-detector.

It is assumed that a numerical aperture of the objective lens of the optical microscope is $NA_m$, a wavelength is $\lambda_m$, an illumination coherence factor is $\delta_m$, and a pitch of the L/S on the wafer is p. Then, it can be seen th at the pitch p that does not permit the ± first order diffraction beam to pass through the pupil of the projection lens needs to satisfy the following expression when the light source size (coherence factor) is taken into account:

$$p \leq \lambda_m/(1+\delta_m)NA_m \quad \text{(Expression 3)}$$

When $\lambda_m = 550$ nm, $NA_m = 0.12$ and $\delta = 0.7$, for example, then $p \leq 2.7$ µm. Therefore, it is reasonable to have the pitch set to 2.6 µm in the present embodiment.

Next, consider a case where the duty ratios of the L/S on the wafer are different. When the duty ratios of the L/S on the wafer are different, the quantity of light diffracted from the wafer 35 and the distribution ratio of the 0-th order diffraction beam 62 and the first order diffraction beam 63 change respectively as shown in FIGS. 18A, 18B, 19A, 19B, 20A, and 20B. As a result, the intensity of the 0-th order diffraction beam changes depending on the duty ratio of the L/S on the wafer 35. Accordingly, when the wafer is observed with the optical microscope, it can be seen that the intensity on the photo-detector plane changes according to the duty ratio.

Quantitatively, the square of a ratio of space widths in the L/S of two kinds of duty ratios is proportional to the ratio of intensity of the 0-th order diffraction beam. In other words, the resolution of the present embodiment in the variation of effective exposure dose is the square of the ratio of the space widths in the L/S of two kinds of duty ratios for the space widths of the closest sizes. As the L/S used in the present embodiment has the space widths changed at every 0.625 nm, the sensitivity at the space width 2253 nm corresponding to a position near the nominal exposure dose 7.5 mJ/cm² becomes as follows:

$$(2259.25/2253)^2 = 1.00555$$

Thus, it can be seen that the resolution is about 0.56% in this case.

As explained above, in the present embodiment, the repetition pitch p between the light transmitting section and the light shielding sections in the mask patterns is set as shown by the Expression 2. Therefore, unlike the first embodiment, although the patterns are resolved on the wafer, the influence of subtle focus variation is negligible and stable patterns are obtained since the pattern sizes are large. Further, by setting the pitch p based on the condition as shown by the Expression 3, it is possible to observe the patterns with the optical microscope under the condition that the patterns are not resolved. Furthermore, it is possible to measure the duty ratio of the L/S on the wafer in high precision.

Moreover, there is no need for a high-precision mask that makes the space width changed at every 0.625 nm step at wafer dimension. It is possible to measure the effective exposure dose variation in sufficiently high precision with a mask of a normal precision of about 6.25 nm step at wafer dimension. Accordingly, it becomes possible to accurately measure the effective exposure dose in a short time without influence of focus variation, in a manner similar to that of the first embodiment.

(Modification)

Although L/S are used as mask patterns in the above-described two embodiments, the present invention is not limited to these. For example, wedge patterns as shown in FIG. 21A may also be used. When these patterns are used according to the system of the first embodiment, the pitches are based on the conditions of the Expression 1, and when these patterns are used according to the system of the second embodiment, the pitches are based on the conditions of the Expressions 2 and 3.

Since the Cr pattern becomes thinner toward the front ends, when the exposure is carried out based on the exposure conditions of the Expression 1, that is, when the exposure and development is carried out under the condition of not resolving the patterns, a residual resist thickness on the wafer is reduced at a position toward the front ends of the mask patterns as shown in FIG. 21B. It becomes possible to obtain the effective exposure dose by measuring a size L between the positions where the resist has been removed. As the wedge type becomes sharper, the sensitivity of variation of the effective exposure dose becomes higher.

When an exposure is carried out under the exposure conditions shown in the Expressions 2 and 3, patterns are formed on the wafer, and when these patterns are observed with the optical microscope under the conditions described in the second embodiment, the intensity of light increases at a position toward the front end of the patterns on the photo-detector plane. It becomes possible to obtain an effective exposure dose by measuring a size L between positions where a certain value of an intensity of light is shown.

By taking into account actual constraints for the fabrication of the mask, there may be employed patterns with a white and black ratio changed stepwise as shown in FIG. 21C. Further, white and black inverted patterns of FIGS. 21A and 21B may also be used to have a similar effect.

It is also possible to obtain a similar effect when periodical hole patterns as shown in FIGS. 22A, 22B, 23A, 23B, 24A, and 24B are used. When hole patterns are disposed on orthogonal coordinates as shown in FIGS. 22A, 23A, and 24A, there may exist a plurality of kinds of patterns in which both x-direction pitch p1 and y-direction pitch p2 meet the Expression 1 or the Expressions 2 and 3 and there are subtle differences in the sizes of apertures. When hole patterns are disposed on not orthogonal coordinates as shown in FIGS. 22B, 23B, and 24B, there may exist a plurality of kinds of patterns in which pitches of p1, p2 and p3 meet the Expression 1 or the Expressions 2 and 3 and there are subtle differences in the sizes of apertures. In both cases, a similar effect can also be obtained when white and black inverted patterns of FIGS. 22A, 22B, 23A, 23B, 24A, and 24B are used.

Figures 25, 26, 27:
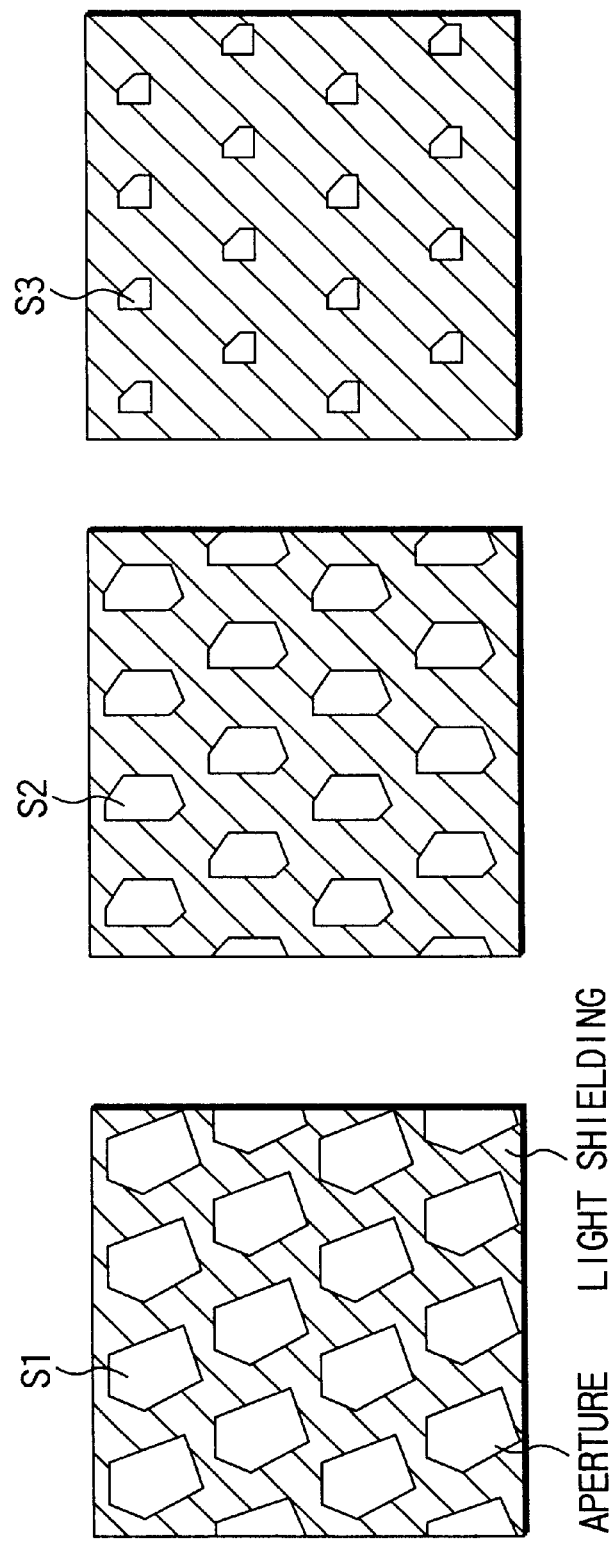
FIG. 25 is a view for showing an example of a general pattern for covering the first and second embodiments of the present invention.
FIG. 26 is a view for showing another example of a general pattern for covering the first and second embodiments of the present invention.
FIG. 27 is a view for showing a further example of a general pattern for covering the first and second embodiments of the present invention.

Further, more in general, when the patterns follow the system of the first embodiment, it is important that the patterns are repetition patterns having a period of pitches p that meet the Expression 1 and there exist a plurality of patterns with subtle changes between their apertures $S_1$, $S_2$ and $S_3$, as shown in FIGS. 25, 26, and 27. Further, when the patterns follow the system of the second embodiment, it is important that the patterns are repetition patterns having a period of pitches p that meet the Expressions 2 and 3 and there exist a plurality of patterns with subtle changes between their apertures $S_1$, $S_2$ and $S_3$. Further, a similar effect can also be obtained when white and black inverted patterns of FIGS. 25A, 25B, and 25C are used.

In the Expressions 1 to 3 of the above embodiments, it has been assumed that the pitches p are expressed as values converted into those on the wafer. When the pitches p on the mask are used directly, the relationships of the pitches are shown by the following Expressions 1' to 3' as the magnification of the projection lens is M:

$$p/M \leq \lambda/(1+\delta)NA \quad \text{(Expression 1)'}$$

$$p/M > \lambda/(1+\delta)NA \quad \text{(Expression 2)'}$$

$$p/M \leq \lambda_m/(1+\delta_m)NA_m \quad \text{(Expression 3)'}$$

Other various modifications may also be employed within a scope of not deviating from the gist of the present invention.

As explained above in detail, according to the present invention, it is possible to accurately measure an effective exposure dose in a short time without an influence of focus variation, by setting the repetition pitches p between the light transmitting section and the light shielding section to the above-described ranges, transferring a plurality of kinds of mask patterns of different rates of the transmission section and the shielding section onto the wafer by exposure, and by observing the patterns on the wafer corresponding to the respective mask patterns.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposure dose measuring method for measuring an effective exposure dose on a wafer, comprising the steps of:

setting a mask formed with mask patterns each having light transmitting sections and light shielding sections repeated in a period p, a ratio of areas of the light transmitting sections to areas of the light shielding sections of each of the mask patterns being different from ratios of those of the others of the mask patterns, to a projection exposure apparatus having an exposure light wavelength $\lambda$, a numerical aperture NA at a wafer side, an illumination coherence factor $\sigma$ and a mask pattern magnification M for patterns to be formed on the wafer;

exposing light through the mask patterns of the mask onto a resist coated on the wafer; and observing a state of exposed portions of the resist on the wafer corresponding to the mask patterns, wherein the period p is set so as to satisfy a relationship of $p/M \leq \lambda/(1+\sigma)NA$.

2. An exposure dose measuring method for measuring an effective exposure dose on a wafer, comprising the steps of:

setting a mask formed with mask patterns each having light transmitting sections and light shielding sections repeated in a period p, a ratio of areas of the light transmitting sections to areas of the light shielding sections of each of the mask patterns being different from ratios of those of the others of the mask patterns, to a projection exposure apparatus having an exposure light wavelength $\lambda$, a numerical aperture NA at a wafer side, an illumination coherence factor $\sigma$ and a mask pattern magnification M for patterns to be formed on the wafer;

exposing light through the mask patterns of the mask onto a resist coated on the wafer; and observing a pattern on the wafer corresponding to the mask patterns, with an optical microscope having a wavelength $\lambda_m$, a numerical aperture $NA_m$ at a wafer side, and an illumination coherence factor $\sigma_m$, wherein the period p is set so as to satisfy relationships of $p/M > \lambda/(1+\sigma)NA$ and $p/M \leq \lambda_m/(1+\sigma_m)NA_m$.

3. An exposure dose measuring method according to claim 1, wherein an area of a light transmitting section of a mask pattern which corresponds to a portion of the wafer where a corresponding portion of the resist has been removed, is measured, and the measured area is converted into an effective exposure dose.

4. An exposure dose measuring method according to claim 1, wherein an area of a light transmitting section of a mask pattern which corresponds to a portion of the wafer where a corresponding portion of the resist has become a predetermined film thickness, is measured, and the measured area is converted into an exposure dose.

5. An exposure dose measuring method according to claim 2, wherein an area of a light transmitting section of a mask pattern which corresponds to a portion of an imaging plane of the optical microscope where the intensity of the exposure has become a predetermined value, is measured, and the measured area is converted into an effective exposure dose.

6. An exposure dose measuring method according to claim 1, wherein the mask patterns are a plurality of kinds of patterns of lines-and-spaces.

7. An exposure dose measuring method according to claim 1, wherein the mask patterns are a plurality of kinds of patterns of repeated holes.

8. An exposure dose measuring method according to claim 1, wherein the mask patterns are a plurality of kinds of patterns of repeated rhombuses.

9. An exposure dose measuring method according to claim 2, wherein the mask patterns are a plurality of kinds of patterns of lines-and-spaces.

10. An exposure dose measuring method according to claim 2, wherein the mask patterns are a plurality of kinds of patterns of repeated holes.

11. An exposure dose measuring method according to claim 2, wherein the mask patterns are a plurality of kinds of patterns of repeated rhombuses.

12. An exposure dose measuring method according to claim 1, wherein the mask patterns are set so as to have a constant change quantity in the area of a light transmitting section.

13. An exposure dose measuring method according to claim 1, wherein the mask patterns are set so as to have a constant change rate in the area of a light transmitting section.

14. An exposure dose measuring method according to claim 2, wherein the mask patterns are set so as to have a constant change quantity in the area of a light transmitting section.

15. An exposure dose measuring method according to claim 2, wherein the mask patterns are set so as to have a constant change rate in the area of a light transmitting section.

16. An exposure dose measuring mask to be used for a measurement of an exposure dose, the mask having mask patterns on a substrate, through which an exposure light is exposed onto a resist coated on a wafer to measure an effective exposure dose on the wafer, wherein the mask patterns each have light transmitting sections and light shielding sections are repeated in a period p, a ratio of areas of the light transmitting sections to areas of the light shielding sections of each of the mask patterns differs from ratios of those of the others of the mask patterns, and the period p is set so as to satisfy a relationship of $p/M \leq \lambda/(1+\sigma)NA$, where an exposure light wavelength at the time of exposing the mask patterns is $\lambda$, a numerical aperture at a wafer side is NA, an illumination coherence factor is $\sigma$, and a mask pattern magnification for patterns to be formed on the wafer is M.

17. An exposure dose measuring mask to be used for a measurement of an exposure dose, the mask having mask patterns on a substrate, through which an exposure light is exposed onto a resist coated on a wafer to measure an effective exposure dose on the wafer, wherein the mask patterns each have light transmitting sections and light shielding sections are repeated in a period p, a ratio of areas of the light transmitting sections to areas of the light shielding sections of each of the mask patterns differs from ratios of those of the others of the mask patterns, and the period p is set so as to satisfy relationships of $p/M > \lambda/(1+\sigma)NA,$ and $p/M \leq \lambda_m/(1+\sigma_m)NA_m$ where an exposure light wavelength at the time of exposing the mask patterns is $\lambda$, a numerical aperture at a wafer side is NA, an illumination coherence factor is $\delta$, and a mask pattern magnification for pattern to be formed on the wafer is M, and when an optical microscope for measuring the patterns on the wafer corresponding to the mask patterns has a wavelength $\lambda_m$, a numerical aperture at a wafer side $NA_m$, and an illumination coherence factor $\delta_m$.

* * * * *

UNITED STATES PATENT AND TRADEMARK OFFICE
CERTIFICATE OF CORRECTION

PATENT NO.    : 6,251,544 B1
DATED         : June 26, 2001
INVENTOR(S)   : Soichi Inoue et al.

It is certified that error appears in the above-identified patent and that said Letters Patent is hereby corrected as shown below:

Column 13,
Line 53, "$(1+\delta)NA$" should read -- $(1+\sigma)NA$ --.

Column 16,
Line 7, "factor is $\delta$" should read -- factor is $\sigma$ --.
Line 12, "factor is $\delta_m$" should read -- factor is $\sigma_m$ --.

Signed and Sealed this

Twenty-fifth Day of June, 2002

Attest:

JAMES E. ROGAN
*Attesting Officer*  *Director of the United States Patent and Trademark Office*